US012739057B2

(12) United States Patent
Barthe et al.

(10) Patent No.: US 12,739,057 B2
(45) Date of Patent: Sep. 15, 2026

(54) DEVICE AND METHOD FOR INTERLEAVING DATA BLOCKS FOR AN OPTICAL COMMUNICATIONS SYSTEM BETWEEN A SATELLITE AND AN EARTH STATION

(71) Applicant: AIRBUS DEFENCE AND SPACE SAS, Toulouse (FR)

(72) Inventors: Lyonel Barthe, Toulouse (FR); Jean-Frédéric Chouteau, Toulouse (FR); Benjamin Gadat, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 250 days.

(21) Appl. No.: 18/694,225

(22) PCT Filed: Sep. 13, 2022

(86) PCT No.: PCT/EP2022/075400
§ 371 (c)(1),
(2) Date: Mar. 21, 2024

(87) PCT Pub. No.: WO2023/046533
PCT Pub. Date: Mar. 30, 2023

(65) Prior Publication Data

US 2024/0388380 A1 Nov. 21, 2024

(30) Foreign Application Priority Data

Sep. 22, 2021 (FR) ....................................... 2109997

(51) Int. Cl.
*H04B 10/00* (2013.01)
*H03M 13/27* (2006.01)
(Continued)

(52) U.S. Cl.
CPC ...... *H04L 1/0071* (2013.01); *H03M 13/2778* (2013.01); *H04B 10/118* (2013.01)

(58) Field of Classification Search
CPC . H04B 10/118; H04B 10/112; H04B 10/1121; H04B 10/1123; H04B 10/1125;
(Continued)

(56) References Cited

U.S. PATENT DOCUMENTS 10,419,034 B2 * 9/2019 Everett ............. H03M 13/2903
2008/0270714 A1 * 10/2008 Van Den Bosch .......................... H03M 13/2707 711/E12.079
2014/0079394 A1 * 3/2014 Xie ...................... H04B 10/532 398/184

FOREIGN PATENT DOCUMENTS

WO 2006085251 A2 8/2006

OTHER PUBLICATIONS

International Search Report for PCT/EP2022/075400, mailed Oct. 17, 2022, 6 pages.

(Continued)

*Primary Examiner* — Hanh Phan
(74) *Attorney, Agent, or Firm* — Nixon & Vanderhye P.C.

(57) ABSTRACT

A device (10) for interleaving data blocks for an optical communications system between a satellite and an earth station. The interleaving device (10) includes a control module (11), a cache memory (15) and an external memory (12). The cache memory (15) includes buffer areas (16). The control module (11) is configured to write each new frame of blocks (21) received in an available buffer area (16), to form (102) groups (22) of interleaved blocks from different blocks (21) belonging to different frames (20) stored in
(Continued)

Figure 1:
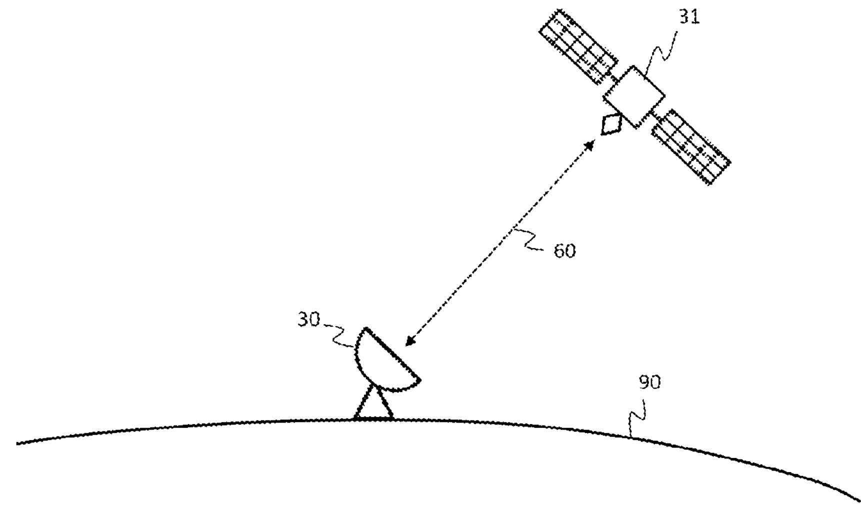

different buffer areas (16), and to write (103) each group (22) of interleaved blocks thus formed in a sequential area (13*b*) of the external memory (12).

17 Claims, 11 Drawing Sheets

(51) Int. Cl.
*H04B 10/118* (2013.01)
*H04L 1/00* (2006.01)

(58) Field of Classification Search
CPC ........... H04B 10/1127; H04B 10/1129; H04B 10/116; H04B 10/114; H04B 10/1143; H04B 10/1149; H04B 10/40; H04B 10/516; H04B 10/548; H04B 10/5561; H04B 10/2507; H04B 7/18513; H04B 7/18526; H04B 7/18508
USPC ....... 398/118, 119, 120, 121, 122, 123, 124, 398/125, 126, 127, 128, 129, 130, 131, 398/115, 135, 136, 183, 188, 158, 159, 398/202, 208, 209, 192, 193, 194, 76; 455/427, 428, 12.1, 13.1
See application file for complete search history.

(56) References Cited

OTHER PUBLICATIONS

Written Opinion of the ISA for PCT/EP2022/075400, mailed Oct. 17, 2022, 7 pages.
Chu Yu et al., "Design of a high-speed block interleaving/deinterleaving architecture for wireless communication applications", Digest of Technical Papers International Conference On Consumer Electronics 2009, ICCE '09, IEEE, Jan. 10, 2009, pp. 1-2, XP031466960.
Jaquenod Guillermo A et al., "A simple BLOCK interleaving algorithm using reduced memory and address generator resources", PROC. 2020 Argentine Conference On Electronics (CAE), IEEE, Feb. 27, 2020, pp. 53-56, XP033745146.

* cited by examiner

DEVICE AND METHOD FOR INTERLEAVING DATA BLOCKS FOR AN OPTICAL COMMUNICATIONS SYSTEM BETWEEN A SATELLITE AND AN EARTH STATION

RELATED APPLICATIONS

This application is the U.S. national phase of International Application No. PCT/EP2022/075400 filed Sep. 13, 2022, which designated the U.S. and claims priority to French patent application FR 2109997 filed Sep. 22, 2021, the entire contents of each of which are hereby incorporated by reference.

FIELD OF THE INVENTION

The present invention belongs to the field of satellite digital communications, and more particularly relates to a device and a method for interleaving data blocks for an optical communications system between a satellite and an earth station.

PRIOR ART

Optical space communications use light beams generated by lasers to transmit data. In comparison with radio wave communications, optical communications make it possible in particular to increase the data rate while reducing the electrical power needed to transmit the data.

An optical signal transporting data to be exchanged between a satellite and a ground station must pass through the Earth's atmosphere. When passing through the atmosphere, the light beam carrying the emitted signal is subjected to a fading phenomenon that generates losses upon receipt of the signal. These losses correspond to periods of fading of the signal during which the carried data may be corrupted, and therefore unusable. A period of fading of the signal may last a plurality of milliseconds, or even tens or hundreds of milliseconds. For high data rates (for example in the order of 10 Gbits/s), this means that a very large number of adjacent data blocks of the signal may be corrupted.

To overcome transmission errors generated by this fading phenomenon, it is known to associate an interleaving device to the traditional error corrector code. The role of the interleaving device is to disperse the data bits that have potentially been subjected to the same fading of the signal. Thus, this makes it possible to limit the number of adjacent bits having been subjected to this fading in a data packet, enabling better operation of the error corrector code.

The CCSDS (Consultative Committee for Space Data Systems), which in particular brings together the main international space agencies, is currently in the process of defining a communications standard offering a rate in the order of 10 Gbits/s and in particular enabling observation satellites to transmit rapidly to the ground a significant amount of data via an optical link. This standard in particular recognises the use of error corrector codes of the "Low Density Parity Check" type (LDPC codes) as well as an interleaving of encoded data blocks to be transmitted.

The conventional data interleaving solutions used for example in the 3GPP (Third Generation Partnership Project) mobile telephony standards or in the DVB-S2 (Digital Video broadcast-Satellite Second Generation) standard, however, are not always well suited to this new standard developed by the CCSDS. Indeed, due to the specific features of the targeted optical communication (high rate a 10 Gbits/s and periods of fading that may last a plurality of hundreds of milliseconds), it is necessary to interleave a very large number of frames. Small interleaving blocks should also be used to optimise the interleaving power.

The CCSDS has created the HPE (High Photon Efficiency) standard to define coding, synchronisation and interleaving techniques needed for the interoperability of optical communications. Nevertheless, the solutions proposed in the HPE standard are based on a relatively complex convolutional interleaving that is not adapted to high-speed communications.

Therefore, to date no satisfactory solution exists for interleaving data to be transmitted between a satellite and an earth station via a high-speed optical communications link.

The patent application WO2006/085251A2 discloses a method for interleaving/deinterleaving data blocks in the field of optical disks.

The document "Design of a high-speed block interleaving/deinterleaving architecture for wireless communication applications", Chu Yu et al., DIGEST OF TECHNICAL PAPERS INTERNATIONAL CONFERENCE ON CONSUMER ELECTRONICS 2009, ICCE '09, IEEE, PISCATAWAY, NJ, USA, 10 Jan. 2009, discloses a method for interleaving/deinterleaving data blocks in the Wi-Fi (IEEE 802.11a/g) or WiMax (IEEE 802.16e) field.

DISCLOSURE OF THE INVENTION

The object of the present invention is to remedy all or some of the drawbacks of the prior art, in particular those exposed above, by proposing a device and a method for interleaving data blocks intended to be transmitted at very high speed via an optical link between a satellite orbiting the Earth and an earth station. A deinterleaving method and device are also proposed.

To this end, and according to a first aspect, the present invention proposes a device for interleaving data blocks for an optical communications system between a satellite and an earth station. Said interleaving device is configured to receive as input data frames, each frame comprising a plurality of ordered data blocks, and to provide as output interleaved data blocks. Said interleaving device comprises a control module and an external memory intended to store the interleaved blocks. Said interleaving device further includes a cache memory comprising a plurality of buffer areas, each buffer area having a size at least equal to the size of a frame. The control module being configured to:

- write each new frame received in an available buffer area,
- form groups of interleaved blocks from different blocks belonging to different frames stored in different buffer areas,
- write each group of interleaved blocks thus formed in a sequential area of the external memory.

A buffer area is considered as available if and only if it does not contain any block that has not yet been used to form a group of interleaved blocks to be written in the external memory.

"Earth station" means a receiving station implemented on the ground (at the Earth's surface) or an airborne receiving station in the lower layers of the Earth's atmosphere (for example at least 80 kilometres from the Earth's surface).

Using an external memory, such as for example a dynamic random access memory (DRAM), makes it possible to manage the interleaving of a large number of frames. The external memory may indeed offer a large storage volume to store a large number of data blocks.

Furthermore, using an intermediate cache memory makes it possible to temporarily store a plurality of frames in order to form a group of interleaved data blocks to be written in a sequential area of the external memory. Each write access to the external memory will then be able to correspond to writing a group of a plurality of interleaved data blocks. Such provisions make it possible to avoid having to write each data block one after the other in the external memory. Writing block by block in the external memory indeed results in a limitation of the performances of the external memory in terms of write rate, in particular if the size of an interleaving block is small, which must be the case to guarantee a satisfactory interleaving power.

In particular embodiments, the invention may further include one or more of the following features, considered separately or according to any technically-feasible combination.

In particular embodiments, the control module and the cache memory are integrated on the same electronic circuit of specific integrated circuit or programmable logic circuit type, and the external memory is different from said electronic circuit.

In particular embodiments, the external memory is a dynamic random access memory, known as DRAM.

In particular embodiments, the cache memory is a static random access memory, known as SRAM.

In particular embodiments, the device is configured to receive as input data frames with a rate at least equal to 1 Gbits/s, or even at least equal to 10 Gbits/s.

In particular embodiments, the size K of a data block is less than or equal to 1024 bits.

In particular embodiments, a frame includes a number N of data blocks at least equal to 60.

In particular embodiments, the product between the size K of a data block and the number $N_B$ of blocks forming a group of interleaved blocks is at least equal to 1024.

In particular embodiments, the number L of frames to be interleaved is at least equal to 1000.

In particular embodiments, the cache memory includes 4, 8 or 16 buffer areas of the size of a data frame.

In particular embodiments, the cache memory includes $N_T$ buffer areas of the "first in, first out" type, $N_T$ being an even integer greater than or equal to four. For indices k, l, m and n set to zero, the control module is configured to:

- for each new frame received:
  - write the frame in the buffer area of index k,
  - increment modulo $N_T$ the index k by one;
- iteratively form groups of blocks to be written in the external memory in the following way:
  - so long as there are still blocks to be extracted in the buffer area of index l:
    - extract a block from the buffer area of index l,
    - add the extracted block to the group of interleaved blocks to be formed,
    - if the group of blocks comprises $N_T/2$ blocks, write the group of blocks in a sequential area of the external memory,
    - increment modulo $(N_T/2-1)$ the index m by one,
    - assign to the index l the value $(n \times N_T/2+m)$,
  - when all of the blocks of the frame stored in the buffer area of index l have been extracted:
    - increment modulo 2 the index n by one,
    - assign to the index l the value $(n \times N_T/2)$.

According to a second aspect, the present invention relates to a device for deinterleaving data blocks for an optical communications system between a satellite and an earth station. Said, deinterleaving device is configured to receive as input sets of L interleaved data blocks, and to provide as output data frames including ordered data blocks. Said deinterleaving device comprises a control module and an external memory intended to store the ordered blocks. Said deinterleaving device further includes a cache memory comprising a plurality of buffer areas, each buffer area having a size at least equal to the size of a set of interleaved blocks. The control module is configured to:

- write in an available buffer area each new set of L interleaved blocks successively received,
- form groups of ordered blocks from different blocks belonging to different sets of blocks stored in different buffer areas,
- write each group of ordered blocks thus formed in a sequential area of the external memory.

A buffer area being considered as available if and only if it does not contain any block that has not yet been used to form a group of ordered blocks to be written in the external memory.

According to a third aspect, the present invention relates to a satellite including a device for interleaving blocks according to any one of the preceding embodiments and/or a deinterleaving device such as described above.

According to a fourth aspect, the present invention relates to an earth station including a device for interleaving blocks according to any one of the preceding embodiments and/or a deinterleaving device such as described above.

According to a fifth aspect, the present invention relates to a method for interleaving data blocks by an interleaving device of an optical communications system between a satellite and an earth station. Said interleaving device is configured to receive as input data frames each comprising a plurality of ordered data blocks, and to provide as output interleaved data blocks. Said interleaving device comprises a control module and an external memory intended to store the interleaved blocks. Said interleaving device further includes a cache memory comprising a plurality of buffer areas, each buffer area having a size at least equal to the size of a frame. Said interleaving method comprising:

- writing each new frame received in an available buffer area,
- forming groups of interleaved blocks from different blocks belonging to different frames stored in different buffer areas,
- writing each group of interleaved blocks thus formed in a sequential area of the external memory.

A buffer area being considered as available if and only if it does not contain any block that has not yet been used to form a group of interleaved blocks to be written in the external memory.

In particular implementations, the cache memory includes $N_T$ buffer areas of the "first in, first out" type, $N_T$ being an even integer greater than or equal to four, and the method includes:

- a phase of writing the frames in the cache memory comprising:
  - setting an index k to zero,
  - receiving a new frame,
  - for each new frame received:
    - writing the frame in the buffer area of index k,
    - incrementing modulo $N_T$ the index k by one;
- a phase of writing the groups of blocks in the external memory comprising:
  - setting indices l, m and n to zero,
  - so long as there are still blocks to be extracted in the buffer area of index l:
    - extracting a block from the buffer area of index l, adding the extracted block to the group of interleaved blocks to be formed, if the group of blocks comprises $N_T/2$ blocks, writing the group of blocks in a sequential area of the external memory, incrementing modulo ($N_T/2-1$) the index m by one, assigning to the index l the value ($n \times N_T/2+m$), when all of the blocks of the frame stored in the buffer area of index l have been extracted:

incrementing modulo 2 the index n by one, assigning to the index l the value ($n \times N_T/2$).

According to a sixth aspect, the present invention relates to a method for deinterleaving data blocks by a deinterleaving device of an optical communications system between a satellite and an earth station. Said deinterleaving device is configured to receive as input sets of L interleaved data blocks, and to provide as output data frames including ordered data blocks. Said deinterleaving device comprises a control module and an external memory intended to store the ordered blocks. Said deinterleaving device further includes a cache memory comprising a plurality of buffer areas each having a size at least equal to the size of a set of interleaved blocks. Said deinterleaving method comprises:

writing in an available buffer area each new set of L interleaved blocks successively received, forming ordered blocks from different blocks belonging to different sets of blocks stored in different buffer areas, writing each group of ordered blocks thus formed in a sequential area of the external memory.

A buffer area being considered as available if and only if it does not contain any block that has not yet been used to form a group of ordered blocks to be written in the external memory.

PRESENTATION OF THE FIGURES

Figure 2:
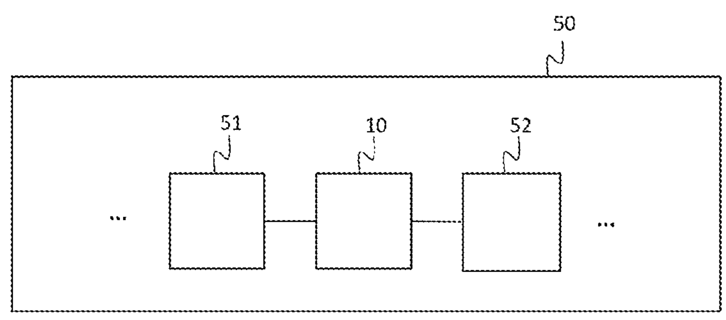
Figure 3:
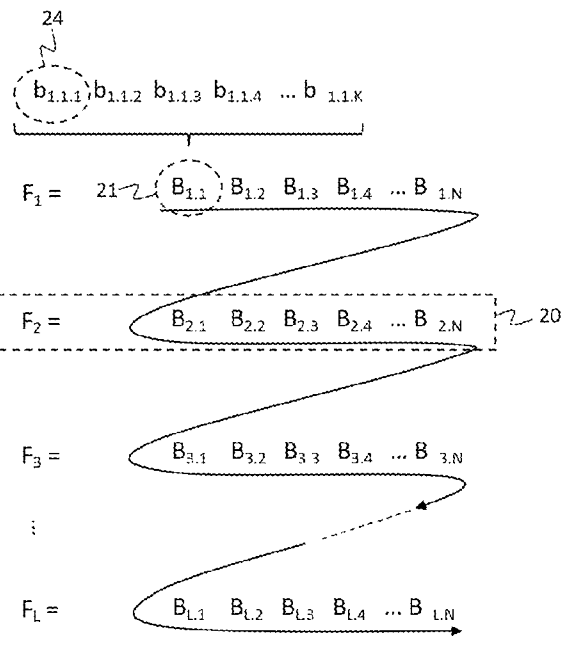
Figure 4:
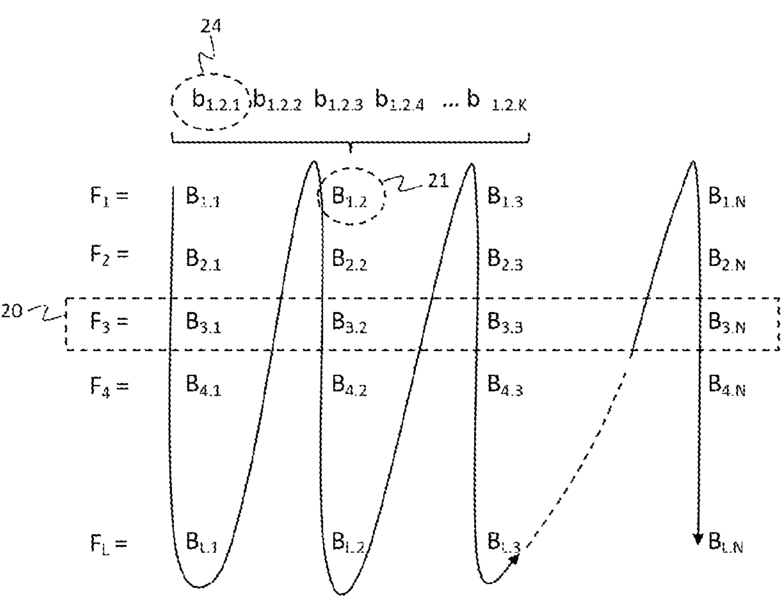
Figure 5:
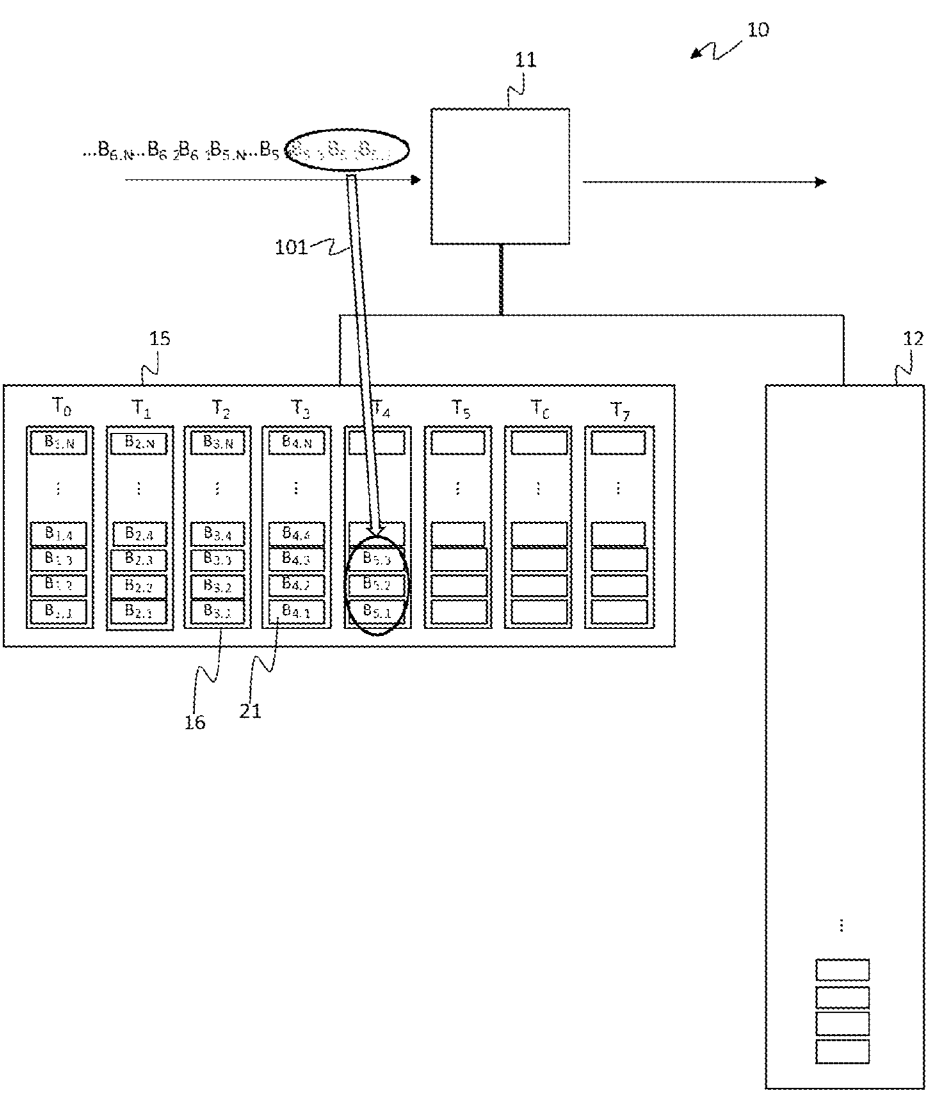
Figure 6:
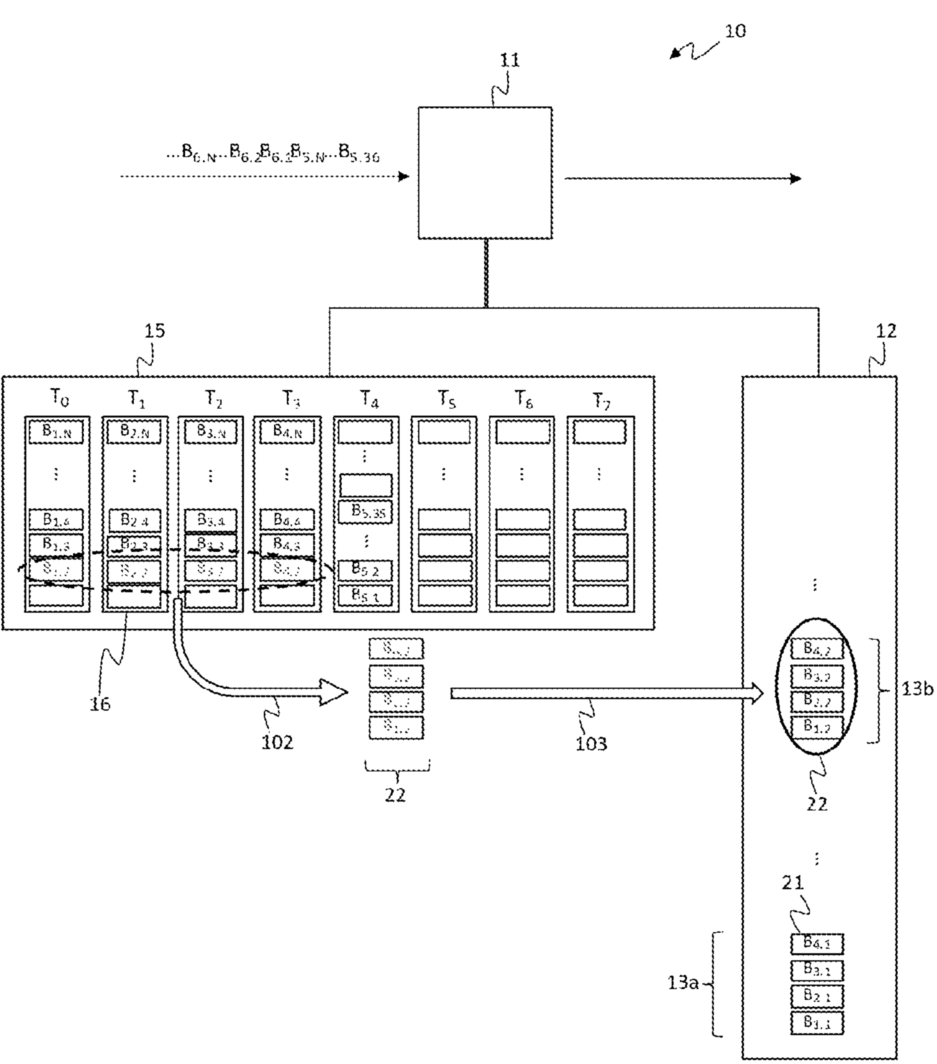
Figure 7:
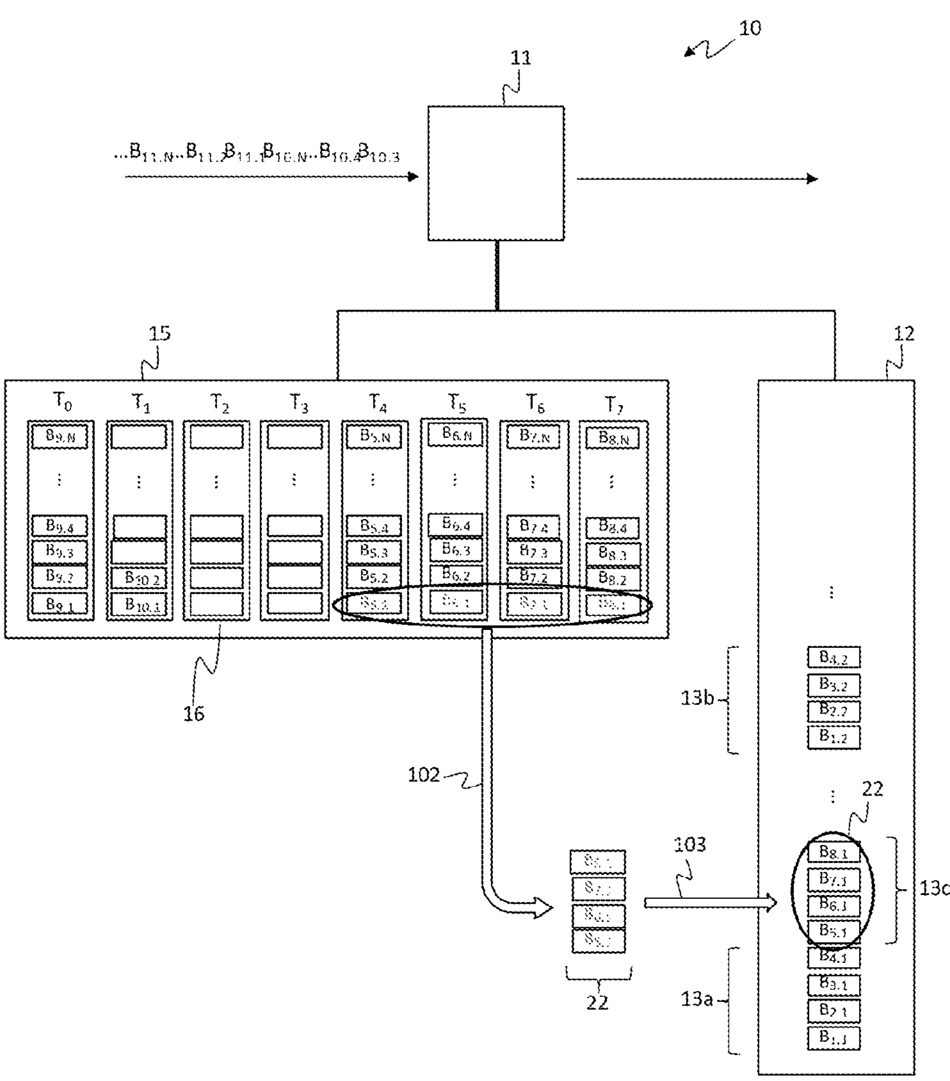
Figure 8:
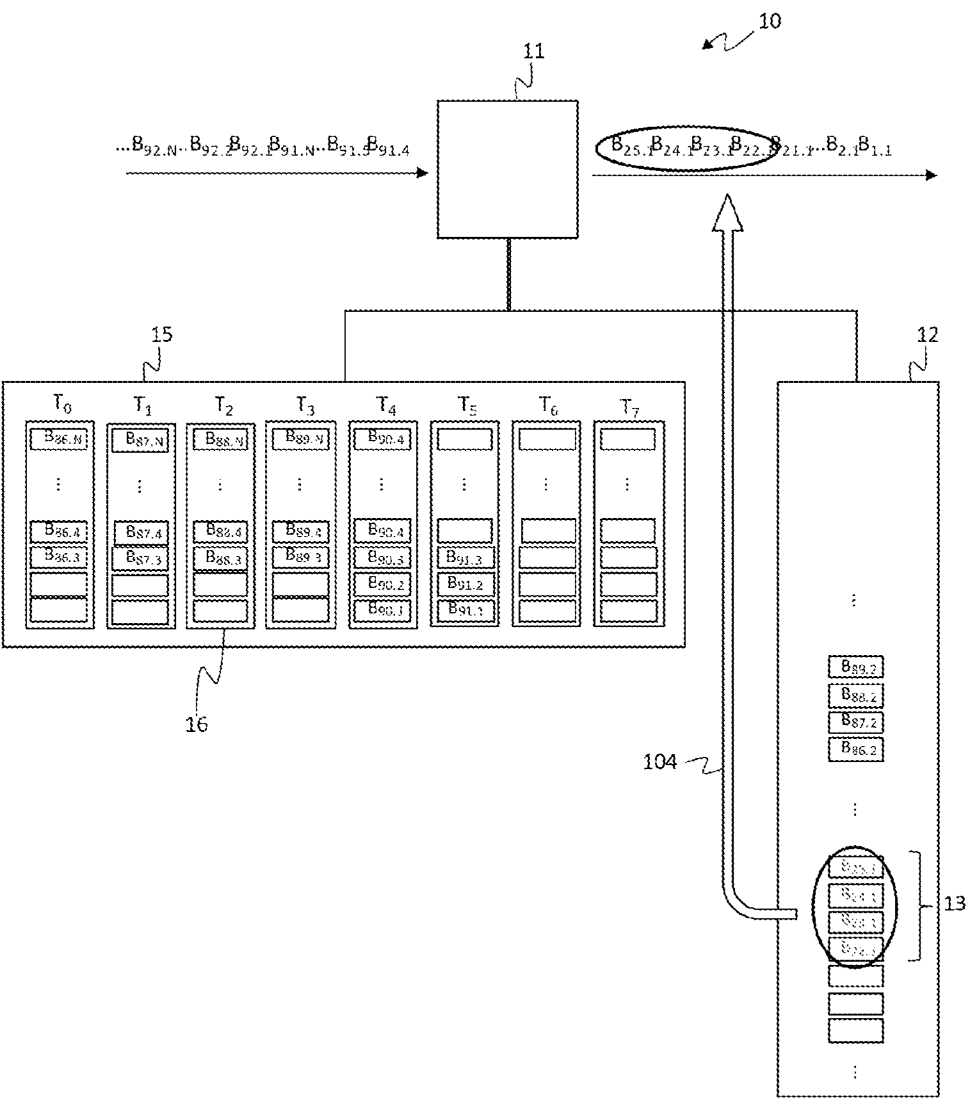
Figure 9:
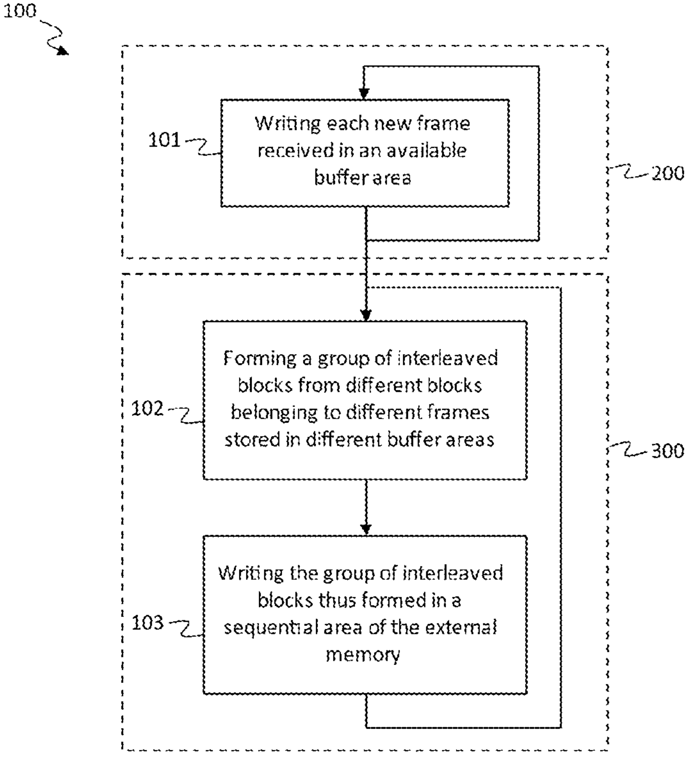
Figure 10:
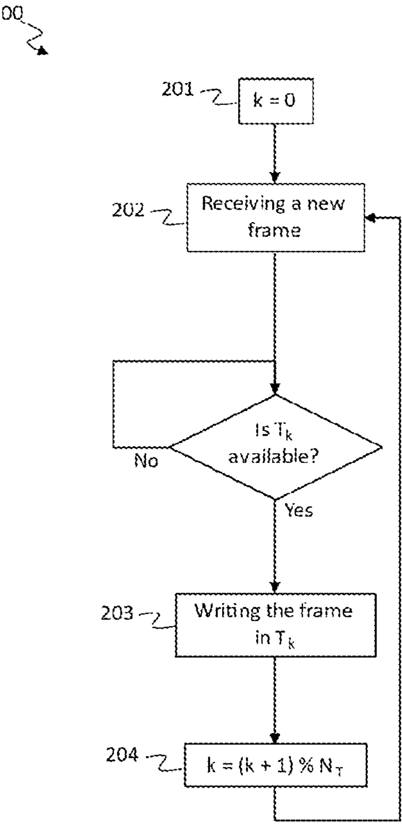
Figure 11:
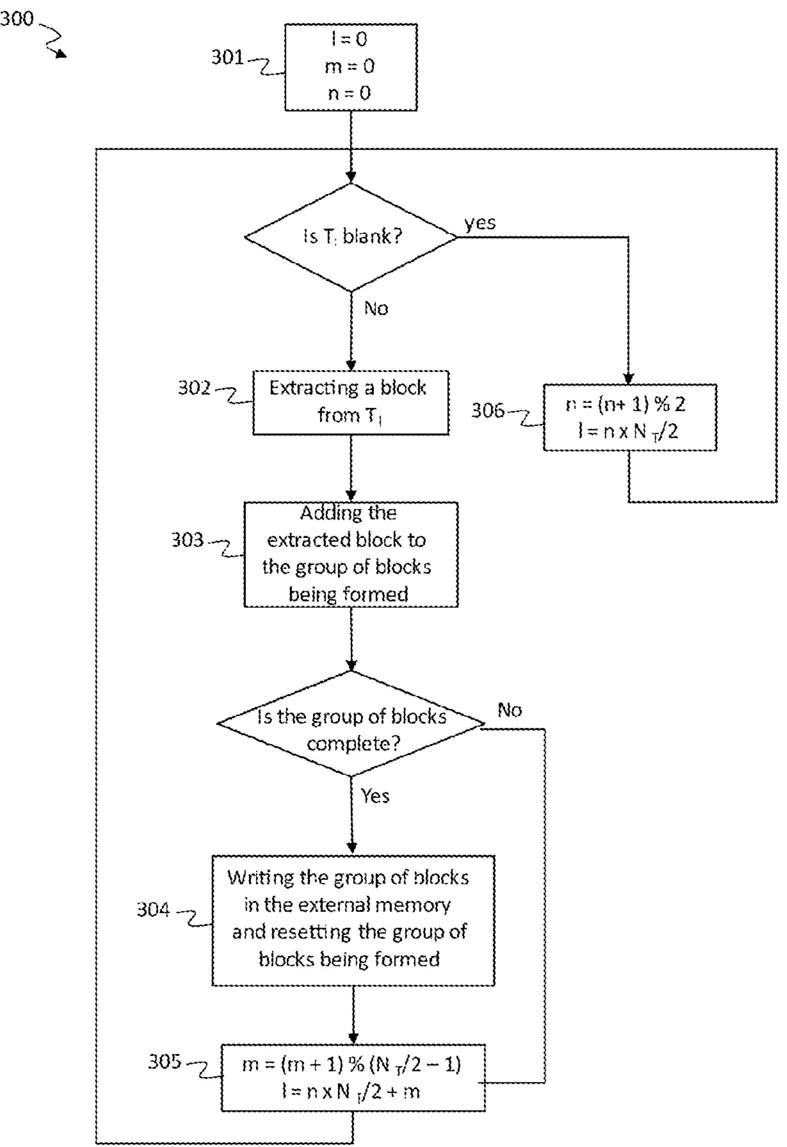
Figure 12:
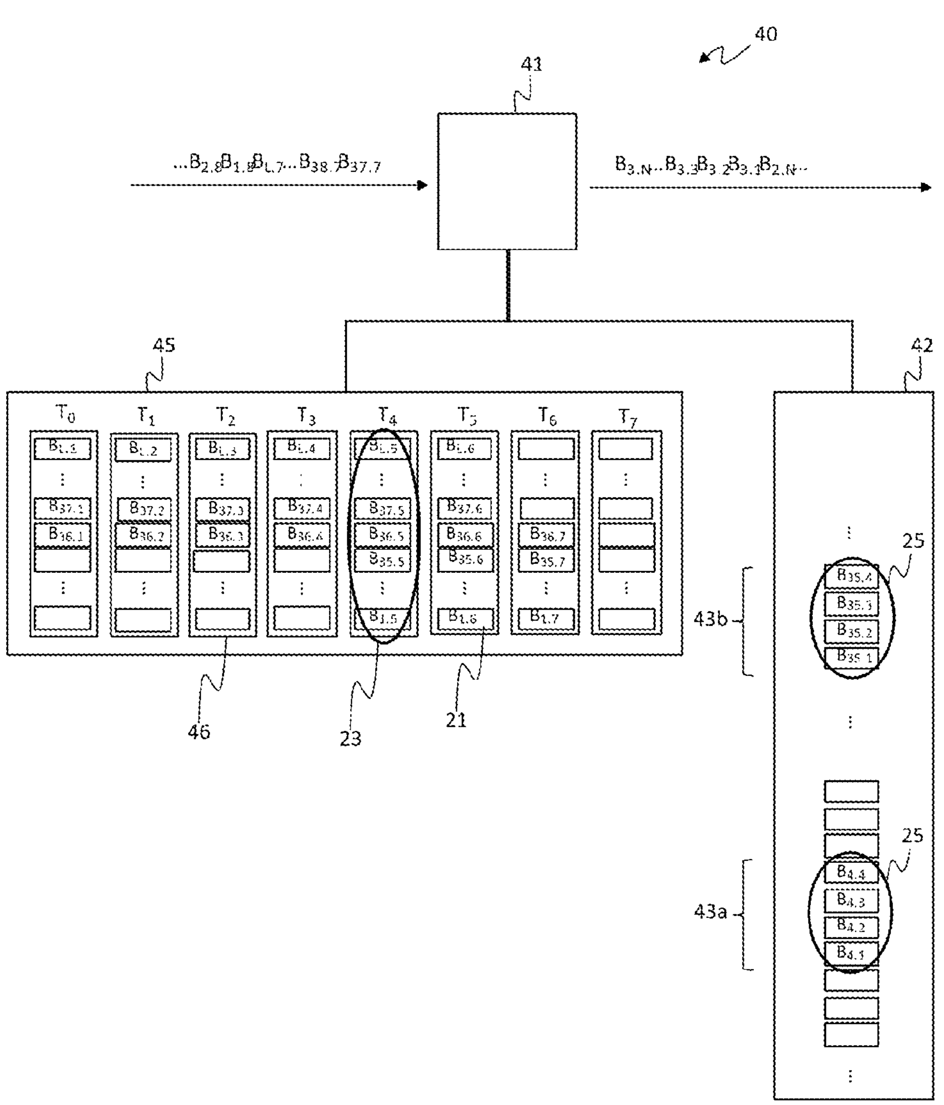

The invention will be better understood upon reading the following description, given by way of non-limiting example, and made with reference to FIGS. 1 to 12 that show:

FIG. 1 a schematic representation of an optical communications system between a satellite orbiting the Earth and a ground station, FIG. 2 an example of embodiment of a transmission chain including an interleaving device according to the invention, FIG. 3 a first illustration of an interleaving of data blocks according to a "row/column" interleaving diagram, FIG. 4 a second illustration of an interleaving of data blocks according to a "row/column" interleaving diagram, FIG. 5 a second illustration of an interleaving of data blocks according to a "row/column" interleaving diagram, FIG. 6 a first illustration of the operation of a device for interleaving data blocks according to the invention, FIG. 7 a second illustration of the operation of a device for interleaving data blocks according to the invention, FIG. 8 a third illustration of the operation of a device for interleaving data blocks according to the invention, FIG. 9 a schematic representation of the main steps of a method for interleaving data blocks according to the invention, FIG. 10 a schematic representation of a particular implementation of a phase of writing the data frames in a cache memory, FIG. 11 a schematic representation of a particular implementation of a phase of writing the interleaved blocks in an external memory, FIG. 12 an illustration of the operation of a device for deinterleaving data blocks according to the invention.

In these figures, identical references from one figure to another designate identical or similar elements. For clarity, the elements shown are not necessarily to the same scale, unless otherwise specified.

DETAILED DESCRIPTION OF AN EMBODIMENT OF THE INVENTION

FIG. 1 schematically shows an optical communications system between a satellite 31 orbiting the Earth 90 and a ground station 30. In the example considered, the earth station 30 is a ground station 30 located at the Earth's surface 90.

An optical signal 60 transporting data to be exchanged between the satellite 31 and the ground station 30 must pass through the Earth's atmosphere. The signal is for example emitted by the satellite 31 and received by the ground station 30. According to another example, the signal is emitted by the ground station 30 and received by the satellite 31.

To emit the optical signal 60, the satellite 31 and/or the ground station 30 includes a transmission chain, FIG. 2 schematically illustrates one example of embodiment of a transmission chain 50. The transmission chain 50 includes different elements, among which figure in particular a channel coding device 51, a device 10 for interleaving data blocks, and a device 52 for modulating interleaved data. The transmission chain 50 may of course include other elements, such as for example a module for generating the data to be transmitted (upstream of the channel coding device 51), and a module for emitting over the optical link modulated data (downstream of the modulation device 52).

When passing through the atmosphere, the light beam carrying the optical signal 60 is subjected to a fading phenomenon that may generate signal losses that may last a plurality of milliseconds, or even tens or hundreds of milliseconds. The data carried by the optical signal 60 may be corrupted during these periods of fading, and become unusable for the receiver of the signal. When the data rate is high (for example in the order of 10 Gbits/s), this means that a very large number of adjacent data blocks of the optical signal 60 may be corrupted.

The aim of the channel coding device 51 and the device 10 for interleaving data blocks is to overcome decoding errors (at the receiver) generated by this fading phenomenon.

The channel coding device 51 may in particular use, conventionally, error corrector codes of the "low density parity check" type (LDPC codes).

The aim of the interleaving device 10 for its part is to interleave data blocks as output of the channel coding device 51 to transmit them non-adjacently, in order to improve the reception of the performances in terms of error detection and correction. The aim of the interleaving of data blocks is to disperse the data bits that have potentially been subjected to the same fading of the signal when passing through the atmosphere. Thus, this makes it possible to limit the number of bits that have been subjected to the same fading in a data packet used at the time of decoding by the receiver.

The blocks interleaved as output of the interleaving device 10 are provided to the modulation device 52.

FIGS. 3 and 4 schematically illustrate the operation of the interleaving device 10 according to a so-called "row/column" interleaving diagram.

As illustrated in FIG. 3, the interleaving device 10 receives as input data frames 20 according to the order indicated by the arrow: firstly the data frame $F_1$, then the frame $F_2$, the frame $F_3$, . . . and the frame $F_L$. The data frames 20 originate from the channel coding device 51. Each data frame 20 includes a plurality of data blocks 21. In the example considered, each data frame 20 includes N data blocks 21. In the example illustrated in FIG. 3, the frame $F_1$ includes the data blocks 21 $B_{1.1}$, $B_{1.2}$, $B_{1.3}$, . . . , $B_{1.N}$; the frame $F_2$ includes the data blocks 21 $B_{2.1}$, $B_{2.2}$, $B_{2.3}$, . . . , $B_{2.N}$; . . . ; the frame $F_L$ includes the data blocks 21 $B_{L.1}$, $B_{L.2}$, $B_{L.3}$, . . . , $B_{L.N}$. Each data block 21 includes a plurality of data bits 24. In the example considered, each data block 21 includes K data bits 24. In the example illustrated in FIG. 3, the data block 21 $B_{1.1}$ includes the data bits 24 $b_{1.1.1}$, $b_{1.1.2}$, $b_{1.1.3}$, . . . , $b_{1.1.K}$.

The interleaving device 10 receives as input the data blocks 21 according to the order indicated by the arrow: firstly the block $B_{1.1}$, then the block $B_{1.2}$, the block $B_{1.3}$, . . . , the block $B_{1.N}$, the block $B_{2.1}$, the block $B_{2.2}$, . . . , the block $B_{2.N}$, . . . , the block $B_{3.1}$, . . . , the block $B_{3.N}$, . . . , the block $B_{L.1}$, . . . , the block $B_{L.N}$. In FIG. 3, a row corresponds to a data frame 20, and the data blocks 21 received successively as input of the interleaving device 10 correspond to the data blocks 21 read row by row.

As illustrated in FIG. 4, the interleaving device 10 provides as output interleaved data blocks 21 according to the order indicated by the arrow: firstly the block $B_{1.1}$, then the block $B_{2.1}$, the block $B_{3.1}$, . . . , the block $B_{L.1}$, the block $B_{1.2}$, the block $B_{2.2}$, . . . , the block $B_{L.2}$, the block $B_{1.3}$, the block $B_{2.3}$, . . . , the block $B_{L.3}$, . . . , the block $B_{1.N}$, the block $B_{2.N}$, . . . , the block $B_{L.N}$. In other words, the interleaved data blocks 21 provided as output of the interleaving device 10 correspond to the data blocks 21 read column by column.

The aim of the optical communications system is to support a high data rate, in particular a rate at least equal to 1 Gbits/s (gigabits per second). In the example considered, the targeted data rate is equal to 10 Gbits/s. Even higher rates may nevertheless be envisaged.

The periods of fading generated by passing through the atmosphere may last a plurality of tens of milliseconds, or even a plurality of hundreds of milliseconds. It is therefore necessary to interleave a very large number of frames. In the example considered, the number L of frames interleaved by the interleaving device 10 is equal to 32640 (L=32640).

On the other hand, small interleaving blocks should also be used to optimise the interleaving power. The smaller the data block 21, the stronger the interleaving power. In other words, the smaller a data block 21 is, the better the efficiency of the interleaving is for dispersing the data blocks and limiting the impact of the fading phenomenon. The size of a data block 21 is defined by the number K of bits contained in the data block 21. Preferably, the size K of a data block is smaller than or equal to 2048 bits. Even more preferably, the size K of a data block is smaller than or equal to 1024 bits, or even smaller than 256 bits. In the example considered, the size K of a data block is equal to 128 bits (K=128).

Advantageously, the number N of data blocks 21 contained in a data frame 20 is at least equal to 60. In the example considered, a data frame includes 30720 data bits; a data frame therefore includes 240 data blocks (K=128; N=240; K×N=30720).

FIGS. 5 to 8 describe in more detail the interleaving device 10. The interleaving device 10 in particular includes a control module 11 integrated on an electronic circuit. The electronic circuit is for example a programmable circuit: a FPGA (Field Programmable Gate Arrays) circuit, or a PLD (Programmable Logic Device) circuit, etc. According to another example, the electronic circuit is a specific integrated circuit, for example an ASIC (Application-Specific Integrated Circuit). The control module 11 is configured to execute program code instructions that implement certain steps of a method for interleaving data blocks 21 as output of the interleaving device 10.

As the number of blocks to be interleaved is large, an external memory 12 should be used that offers a large storage volume, such as for example a DRAM (Dynamic Random Access memory). This external memory 12 may be different from the electronic circuit comprising the control module 11 (in other words, the external memory 12 does not form part of the electronic circuit comprising the control module 11). The external memory 12 makes it possible to manage the interleaving of a large number of frames (the external memory 12 may indeed offer a large storage volume to store a large number of data blocks).

The write access to the external memory 12 by the control module 11 may in particular be performed, conventionally, via a DMA (Direct Memory Access) type controller.

Nevertheless, it should be noted that the use of an external memory 12 of the DRAM type is not essential to the invention, and that other types of memories may possibly be envisaged. The use of an external memory 12 of the DRAM type, nevertheless, offers a good compromise in terms of access time, theoretical bandwidth, storage volume, cost and endurance. It should also be noted that the term DRAM encompasses a plurality of types of memories, for example of the DDR SDRAM (Double Data Rate Synchronous Dynamic Random Access Memory) type memory, the HBM (High-Bandwidth Memory) type memories, etc.

The performances of a DRAM type memory are, however, better when each write access to the memory is carried out to write a large number of data in a sequential (adjacent) area of the memory. The performances of a DRAM type memory on the other hand degrade rapidly when the data are written in the memory in the form of successive writing of a small number of data in non-adjacent areas.

To overcome this problem, the interleaving device 10 according to the invention provides using an intermediate cache memory 15 making it possible to temporarily store a plurality of data frames 20 in order to form a group 22 of interleaved data blocks 21 to be written in a sequential area 13 of the external memory 12 ("sequential area" means an adjacent section of blocks of the external memory 12). Each write access to the external memory 12 may thus correspond to writing a group 22 of a plurality of interleaved data blocks 21. Such provisions make it possible to avoid having to write each data block 21 one after the other in the external memory 12. Preferably the size K of a data block 21 and the number $N_B$ of blocks forming a group 22 of blocks to be written in a sequential area 13 of the external memory 12 are chosen so that the product between $N_B$ and K is at least equal to 1024 ($N_B \times K \geq 1024$).

The cache memory 15 may in particular be integrated into the electronic circuit comprising the control module 11. Nevertheless, nothing prevents the cache memory 15 from corresponding to an electronic circuit different from the electronic circuit comprising the control module 11. The cache memory 15 is for example an SRAM (Static Random Access Memory) type memory. An SRAM type memory is more expensive, less dense and more energy consuming than a DRAM type memory, but it offers better performances in terms of access time and of bandwidth.

In the example considered, and as illustrated in FIGS. 5 to 8, the cache memory 15 includes eight buffer areas 16 (these buffer areas are named $T_0$, $T_1$, $T_2$, . . . , $T_7$). Each buffer area 16 has a size at least equal to the size of a data frame 20. Each buffer area 16 may thus make it possible to temporarily store a data frame 20.

Preferably, the number of buffer areas 16 is even. For example, the number of buffer areas is equal to four, eight or sixteen.

FIGS. 5 to 8 illustrate different steps 101 to 104 implemented by the control module 11 for interleaving data blocks 21. FIG. 9 also describes these different steps in the form of an interleaving method 100 implemented by the control module 11.

FIG. 5 and FIG. 9 describe in particular, for each new data frame 20 received as input of the interleaving device 10, a step of writing 101 said data frame 20 in an available buffer area 16. Repeating these different write steps 101 corresponds to a phase of writing 200 the frames 20 in the cache memory 15.

In FIG. 5, the frame $F_1$ comprising the data blocks $B_{1.1}$, to $B_{1.N}$ is stored in the buffer area $T_0$; the frame $F_2$ comprising the data blocks $B_{2.1}$ to $B_{2.N}$ is stored in the buffer area $T_1$; the frame $F_3$ comprising the data blocks $B_{3.1}$ to $B_{3.N}$ is stored in the buffer area $T_2$; the frame $F_4$ comprising the data blocks $B_{4.1}$ to $B_{4.N}$ is stored in the buffer area $T_3$. In FIG. 5, the interleaving device 10 is in the process of receiving the frame $F_5$: the data blocks 21 $B_{5.1}$, $B_{5.2}$ and $B_{5.3}$ are already stored in the buffer area $T_4$. The following blocks $B_{5.4}$ to $B_{5.N}$ of the frame $F_5$ will be stored in the buffer area $T_4$ as they are received.

Each new data frame 20 received as input of the interleaving device 10 is thus successively stored in an available buffer area 16. A buffer area 16 is considered as available if and only if it does not contain any data block 21 that has not yet been used to form a group 22 of interleaved blocks to be written in the external memory 12. In FIG. 5, the buffer areas $T_5$, $T_6$ and $T_7$ are available for storing respectively the frames $F_5$, $F_7$ and $F_8$ that will soon be received by the interleaving device 10.

FIGS. 6, 7 and 9 describe the step of forming 102 a group 22 of interleaved blocks from different blocks 21 belonging to different frames 20 stored in different buffer areas 16. These figures also describe a step of writing 103 the group 22 of interleaved blocks thus formed in a sequential area 13 of the external memory 12. Repeating these different steps 102 and 103 corresponds to a phase of writing 300 the groups 22 of blocks in the external memory 12.

In FIG. 6, the interleaving device 10 is still in the process of receiving the frame $F_5$: the data blocks 21 $B_{5.1}$ to $B_{5.35}$ are stored in the buffer area $T_4$. The following blocks $B_{5.3}$ to $B_{5.N}$ of the frame $F_5$ will be stored in the buffer area $T_4$ as they are received. Furthermore, a first group 22 of interleaved blocks 21 comprising the blocks $B_{1.1}$, $B_{2.1}$, $B_{3.1}$ and $B_{4.1}$, has already been formed then written in a sequential area 13*a* of the external memory 12. FIG. 6 illustrates the formation 102 of a second group 22 of interleaved blocks, and the writing 103 of this group 22 of interleaved blocks in another sequential area 13*b* of the external memory 12. This second group 22 of interleaved blocks comprises the blocks $B_{1.2}$, $B_{2.2}$, $B_{3.2}$ and $B_{4.2}$ extracted respectively from buffer areas $T_0$, $T_1$, $T_2$ and $T_3$. Each group 22 of interleaved blocks to be written in a sequential area of the external memory are extracted from different data frames 20 stored in different buffer areas 16. It can be noted that the sequential area 13*a* and the sequential area 13*b* are not adjacent. Indeed, the available memory blocks between these two areas will be used to subsequently store therein the interleaved blocks $B_{5.1}$ to $B_L$.

In the example considered, each group 22 of interleaved blocks comprises four data blocks 21. Each group 22 of interleaved blocks to be written in a sequential area of the external memory 12 therefore includes 512 bits (four times more than the size of a data block 21). Thus, this makes it possible to optimise the write access to the external memory 12. It is indeed much more efficient to create a single write access of 512 bits rather than four write accesses of 128 bits.

In FIG. 7, the interleaving device 10 is in the process of receiving the frame $F_{10}$: the data blocks 21 $B_{10.1}$ and $B_{10.2}$ are stored in the buffer area $T_1$. The following blocks $B_{10.3}$ to $B_{10.N}$ of the frame $F_{10}$ will be stored in the buffer area $T_1$ as they are received. The frame $F_{11}$ will subsequently be stored in the buffer area $T_2$ that is available. The frame $F_{12}$ will subsequently be stored in the buffer area $T_3$.

FIG. 7 further illustrates the formation 102 of a group 22 of interleaved blocks comprising the blocks $B_{5.1}$, $B_{6.1}$, $B_{7.1}$ and $B_{8.1}$ from data blocks of frames $F_5$, $F_6$, $F_7$ and $F_6$ that have been stored respectively in the buffer areas $T_4$, $T_5$, $T_6$ and $T_7$. FIG. 8 also illustrates the writing 103 of this group 22 of interleaved blocks in a sequential area 13*c* of the external memory 12. The sequential area 13*c* is adjacent with the sequential area 13*a*.

The data interleaving device 10 is dimensioned such that at the time when the frame $F_{13}$ will arrive, all of the blocks stored in the buffer areas $T_4$ to $T_7$ will have been extracted to form groups of interleaved blocks to be written in the external memory 12. Thus the buffer area $T_4$ will be available to store the frame $F_{13}$.

FIG. 8 for its part describes a step of reading 104 a group of interleaved blocks stored in a sequential area 13 of the external memory 12. In the example illustrated in FIG. 8, the interleaved blocks read are the blocks $B_{22.1}$, $B_{23.1}$, $B_{24.1}$ and $B_{25.1}$. These blocks are provided as output of the interleaving device 10 and made available for the modulation device 52. In the example illustrated in FIG. 8, the interleaved blocks $B_{1.1}$ to $B_{22.1}$, had already been read beforehand from the external memory 12 and provided as output of the interleaving device 10.

It should be noted that the number of blocks to be read in a sequential area of the external memory 12 during the reading step 104 is not necessarily aligned on the number $N_B$ of blocks forming a group of blocks during the writing in the external memory 12. For example, it is possible to write, during the writing step 103, groups of four blocks of 128 bits ($N_B$=4, K=128) and to read, during step 104, groups of eight blocks of 128 bits. Nevertheless, the blocks that are read during step 104 should be adjacent in the external memory 12. In the example considered and illustrated in FIG. 8, the same number of blocks form a group to be written and a group to be read in the external memory 12.

It can be further noted in FIG. 8 that the interleaving device 10 is in the process of receiving the frame $F_{91}$ that is temporarily stored in the buffer area $T_5$. The groups of interleaved blocks are currently formed from frames $F_{86}$, $F_{87}$, $F_{86}$, and $F_{89}$ stored respectively in the buffer areas $T_0$, $T_1$, $T_2$, and $T_3$, The phase of writing 200 the frames 20 in the cache memory 15, the phase of writing 300 the groups 22 of blocks in the external memory 12, and the phase of reading the interleaved blocks in the external memory 12, are executed in parallel with one another.

FIGS. 10 and 11 show respectively the phase of writing 200 the frames 20 in the cache memory 15, and the phase of writing 300 the groups 22 of blocks in the external memory 12, for a particular implementation of the method for interleaving 100 by the interleaving device 10. In this particular implementation, it is considered that the number $N_T$ of buffer areas 16 is equal to twice the number $N_B$ of blocks of a group 22 of interleaved blocks to be written in the external memory 12 ($N_T$=8 and $N_B$=$N_T$/2=4 in the example considered).

As illustrated in FIG. 10, the phase of writing 200 the frames 20 in the cache memory 15 includes the following steps of:

- setting 201 an index k to zero (k=0), the index k that may vary between 0 and ($N_T$−1) in order to identify the buffer areas $T_0$ to $T_7$;
- receiving 202 a new data frame 20 by the interleaving device 10;
- for each new frame 20 received:
  - writing 203 the frame 20 received in the buffer area 16 of index k,
  - incrementing 204 modulo $N_T$ the index k by one (k=(k+1) % $N_T$).

If the buffer area 16 of index k is not available, it is advisable to wait until it becomes available. An active wait loop may be put in place for this purpose. Nevertheless, it is possible to dimension the interleaving device 10 so that the ratio between the speed of writing the interleaved blocks in the external memory 12 and the speed of writing the frames 20 in the buffer areas of the cache memory 15 is such that the buffer area of index k is always available at the time when a new frame must be stored therein.

As illustrated in FIG. 11, the phase of writing 300 the groups 22 of blocks in the external memory 12 includes the following steps of:

- setting 301 indices l, m and n to zero (l=0; m=0; n=0); l is an index varying between 0 and ($N_T$−1) to identify a buffer area; m is an index varying between 0 and ($N_T$/2−1); n is an index varying between 0 and 1.
- so long as there are still blocks 21 to be extracted in the buffer area 16 of index l:
  - extracting 302 a block 21 from the buffer area 16 of index l,
  - adding 303 the extracted block to the group 22 of interleaved blocks to be formed,
  - if the group 22 of blocks comprises $N_T$/2 blocks (that is to say if the group 22 of blocks is complete), writing 304 the group 22 of blocks in a sequential area 13 of the external memory 12,
  - incrementing 305 modulo ($N_T$/2−1) the index m by one,
  - assigning 305 to the index l the value (n×$N_T$/2+m),
- when all of the blocks 21 of the frame 20 stored in the buffer area 16 of index l have been extracted:
  - incrementing 306 modulo 2 the index n by one,
  - assigning 306 to the index l the value (n×$N_T$/2).

The principles described above may be reused to implement a device and a method for deinterleaving data blocks 21 at the receiver. The deinterleaving device is for example implemented in a receiving chain further including a device for receiving data over the optical communications link, a demodulation device, and a channel decoding device. Interleaved data received by the receiving device are provided to the demodulation device. The demodulation device provides interleaved data blocks as input of the deinterleaving device. The deinterleaving device is configured to provide as output frames of ordered data blocks. The ordered data blocks as output of the deinterleaving device are made available for the channel decoding device.

The deinterleaving device may in particular be included in a receiving chain of the satellite 31 and/or in a receiving chain of the ground station 30 described with reference to FIG. 1.

FIG. 12 describes an example of deinterleaving device 40. The deinterleaving device 10 in particular includes a control module 41 integrated on an electronic circuit. The electronic circuit is for example an FPGA, PLD or ASIC type programmable circuit. The control module 41 is configured to execute program code instructions that implement certain steps of a method for deinterleaving data blocks 21 as output of the deinterleaving device 40.

The deinterleaving device 40 further includes an external memory 42, for example of the DRAM type, intended to store the ordered data blocks. This memory 42 may be different from the electronic circuit comprising the control module 41.

The deinterleaving device 40 further includes a cache memory 45 making it possible to temporarily store a plurality of interleaved data sets 23 in order to form a group 25 of ordered data blocks 21 to be written in a sequential area 43 of the external memory 42.

Each write access to the external memory 42 may thus correspond to writing a group 25 of a plurality of ordered data blocks 21. Such provisions make it possible to avoid having to write each data block 21 one after the other in the external memory 42.

The cache memory 45 may in particular be integrated into the electronic circuit comprising the control module 41. Nevertheless, nothing prevents the cache memory 15 from corresponding to an electronic circuit different from the electronic circuit comprising the control module 11. The cache memory 45 is for example an SRAM type memory.

It can be noted that in the case of interleaving (upon the emission) the size of the cache memory (15) is dimensioned by the number N of blocks 21 forming a data frame 20, whereas in the case of deinterleaving (upon the receipt) the size of the cache memory (15) is dimensioned by the number L of interleaved frames. If the amount of SRAM needed is very high, it is possible to use a plurality of dedicated SRAM chips.

In the example considered, and as illustrated in FIG. 12, the cache memory 45 includes eight buffer areas 46 (these buffer areas are named $T_0$, $T_1$, $T_2$, . . . , $T_7$). Each buffer area 46 has a size at least equal to the size of a set 23 of interleaved data blocks. Each buffer area 46 may thus make it possible to temporarily store a set 23 of interleaved data blocks 21.

The control device 41 is in particular configured to:

- write in an available buffer area 46 each new set 23 of L interleaved blocks 21 successively received as input of the deinterleaving device 40,
- form groups 25 of ordered blocks from different blocks 21 belonging to different sets 23 of blocks stored in different buffer areas 46,
- write each group 25 of ordered blocks thus formed in a sequential area 43 of the external memory 42.

A buffer area 46 is considered as available if and only if it does not contain any block 21 that has not yet been used to form a group 25 of ordered blocks 21 to be written in the external memory 42.

In FIG. 12, the set 23 of interleaved data blocks 21 corresponding to the blocks $B_{1.1}$ to $B_{L.1}$, has been stored in the buffer area $T_0$. The set 23 corresponding to the interleaved blocks $B_{1.2}$ to $B_{L.2}$ has been stored in the buffer area $T_1$. The set 23 corresponding to the interleaved blocks $B_{1.3}$ to $B_{L.3}$ has been stored in the buffer area $T_2$. The set 23 corresponding to the interleaved blocks $B_{1.4}$ to $B_{L.4}$ has been stored in the buffer area $T_3$. The set 23 corresponding to the interleaved blocks $B_{1.5}$ to $B_{L.5}$ has been stored in the buffer area $T_4$. The set 23 corresponding to the interleaved blocks $B_{1.6}$ to $B_{L.6}$ has been stored in the buffer area $T_5$. The set 23 corresponding to the interleaved blocks $B_{1.7}$ to $B_{L.7}$ is in the process of being received by the deinterleaving device 41: the blocks $B_{1.7}$ to $B_{36.7}$, are already stored in the buffer area $T_6$, the following blocks $B_{37.7}$ to $B_{L.7}$ will be stored in the buffer area $T_6$ as they are received. The sets 23 stored in the buffer areas $T_0$ to $T_3$ are currently used to form groups 25 of ordered blocks to be written in the external memory 42. In particular, it can be observed that the group 25 of ordered blocks $B_{4.1}$ to $B_{4.4}$ has been stored in a sequential area 43*a* of the external memory 42, and that the groups 25 of ordered blocks $B_{35.1}$ to $B_{35.4}$ has been stored in another sequential area 43*b* of the external memory 42. The sequential area 43*a* and the sequential area 43*b* are not adjacent. Indeed, the memory blocks available between these two areas will be used to subsequently store therein the ordered blocks $B_{4.5}$ to $B_{34.N}$ ($B_{4.5}$, $B_{4.6}$, . . . , $B_{4.N}$, $B_{5.1}$, $B_{5.2}$, . . . , $B_{5.N}$, . . . , $B_{34.1}$, $B_{34.2}$, . . . , $B_{34.N}$).

The description, above clearly illustrates that, due to its different features and their advantages, the present invention achieves the objectives defined by proposing an interleaving (or deinterleaving) method and device particularly well suited for very high-speed optical communications between a satellite orbiting the Earth and an earth station.

It should be noted that the implementations and embodiments considered above have been described by way of non-limiting examples, and that other variants could consequently be considered.

In particular, the values of the number $N_T$ of buffer areas 16 in the cache memory 15 of the interleaving device 10 of the size K of a data block 21, of the number N of blocks 21 forming a data frame 20, of the number L of frames 20 to be interleaved, or of the number $N_B$ of blocks 21 to be used to form a group 22 of interleaved blocks, have been given by way of examples. The choice of other values for these parameters merely constitutes a variant of the invention.

In addition, the particular algorithm described with reference to FIGS. 3 to 8, 10 and 11 is merely an example of implementation of the interleaving method 100 according to the invention. Of course, other variants are possible.

In particular, the writing of a frame 20 in a buffer area 16 may be carried out block by block as the blocks are received by the interleaving device 10, or in one go after all of the blocks 21 of the frame 20 have been received. In addition, although it is more intuitive to browse the buffer areas in increasing order of the indices, nothing prevents using firstly the buffer areas of even indices, then the buffer areas of odd indices. These different algorithmic alternatives merely constitute variants of the invention.

The invention has been described by way of example within the scope of an optical communication between a satellite orbiting the Earth and a ground station at the Earth's surface. Nevertheless, nothing would prevent the invention from being applied to an optical communication between a satellite and an airborne station in the lower layers of the Earth's atmosphere.

The invention claimed is:

1. A device for interleaving data blocks for an optical communications system between a satellite and an earth station, the interleaving device configured to receive as input data frames, each of the data frames comprising a plurality of ordered data blocks, and the interleaving device is configured to provide as output interleaved data blocks,
- said interleaving device comprising a control module, an external memory configured to store the interleaved data blocks and a cache memory comprising a plurality of buffer areas, each of the buffer areas have a size at least equal to a size of one of the data frames,
- the control module is configured to:
  - write each new data frames received in an available one of the buffer areas,
  - form groups of the interleaved data blocks from different ones of the data blocks belonging to different ones of the data frames stored in different buffer areas,
  - write each of the groups of the interleaved blocks in a sequential area of the external memory,
- wherein each of the buffer areas is available if and only if the buffer area does not contain any of the data blocks that has not yet been used to form one of the groups of the interleaved blocks to be written in the external memory.

2. The device for interleaving blocks according to claim 1, wherein the control module and the cache memory are integrated on an electronic circuit of an integrated circuit or a programmable logic circuit, and the external memory is separate from said electronic circuit.

3. The device for interleaving blocks according to claim 1, wherein the external memory is a dynamic random access memory.

4. The device for interleaving blocks according to claim 1, wherein the cache memory is a static random access.

5. The device for interleaving blocks according to claim 1, wherein the device is configured to receive as input the data frames with a rate at least equal to 1 Gbits/s.

6. The device for interleaving blocks according to claim 1, wherein a size K of a data block is no greater than 1024 bits.

7. The device for interleaving blocks according to claim 6 wherein each of the frames includes a number N of data blocks, wherein N is at least 60.

8. The device for interleaving blocks according to claim 1, wherein the product of a size of one of the data blocks and a number of blocks forming a group of interleaved blocks is at least equal to 1024.

9. The device for interleaving blocks according to claim 1, wherein a number L of the data frames to be interleaved is at least 1000.

10. The device for interleaving blocks according to claim 1, wherein the cache memory includes 4, 8 or 16 buffer areas and each of the buffer areas has a size of one of the data frames.

11. The device for interleaving blocks according to claim 1, wherein the cache memory includes $N_T$ buffer areas of a first in, wherein the $N_T$ is an even integer greater than or equal to four, and for indices k, l, m and n set to zero, the control module is configured to:
- for each new data frame received:
  - write the frame in the buffer area of index k,
  - increment modulo $N_T$ the index k by one;
- iteratively form the groups of the interleaved blocks to be written in the external memory as follows:
  - so long as there are still ones of the interleaved data blocks to be extracted in the buffer area of index l:
    - extract one of the interleaved data blocks from the buffer area of index l,
    - add the extracted interleaved data block to the group of interleaved data blocks to be written,
    - if the group of interleaved data blocks comprises $N_T/2$ blocks, write the group of interleaved data blocks in a sequential area of the external memory,
  - increment modulo $(N_T/2-1)$ the index m by one,
  - assign to the index l the value $(n \times N_T/2+m)$, when all of the interleaved data blocks of the frame stored in the buffer area of index l have been extracted:

increment modulo 2 the index n by one, and assign to the index l the value $(n \times N_T/2)$.

12. A satellite including the device for interleaving blocks according to claim 1.

13. An earth station including the device for interleaving blocks according to claim 1.

14. A device for deinterleaving data blocks for an optical communications system between a satellite and an earth station, said deinterleaving device configured to receive as input sets of L interleaved data blocks, and to provide as output data frames including ordered data blocks, said deinterleaving device comprising a control module and an external memory configured to store the ordered data blocks, and a cache memory comprising a plurality of buffer areas, wherein each of the buffer areas has a size of at least a size of one of the sets of the interleaved data blocks, the control module configured to:

write in an available one of the buffer areas each of the sets of the L interleaved blocks successively received, form groups of the ordered data blocks from different ones of the data blocks belonging to different ones of the sets of the L interleaved data blocks stored in different ones of the buffer areas, write each of the groups of the ordered blocks in a sequential area of the external memory, wherein each of the buffer areas is available if and only if the buffer area does not contain any of the interleaved data blocks that has not yet been used to form one of the groups of the ordered blocks to be written in the external memory.

15. A method for interleaving data blocks by an interleaving device for interleaving data blocks for an optical communications system handling communications between a satellite and an earth station, said interleaving device configured to receive as input data frames each comprising a plurality of ordered data blocks, and to provide as output interleaved data blocks, said interleaving device comprising:

a control module, an external memory configured to store the interleaved blocks, and a cache memory comprising a plurality of buffer areas, each of the buffer areas has a size at least equal to a size of one of the data frames, said method comprising:

writing each new one of the data frames received in an available buffer area of the buffer areas, forming groups of the interleaved data blocks from different ones of the ordered data blocks belonging to different ones of the frames stored in different ones of the buffer areas, writing each of the groups of the interleaved blocks in a sequential area of the external memory, wherein each of the buffer areas is available if and only if the buffer area does not contain any of the ordered data blocks that has not yet been used to form one of the groups of the interleaved blocks to be written in the external memory.

16. The method according to claim 15, wherein the cache memory includes $N_T$ of the buffer areas which are each a first in, first out buffer area, and said $N_T$ being an even integer greater than or equal to four, and the method includes:

a phase of writing the data frames in the cache memory comprising:

setting an index k to zero, receiving one of the data frames;

for the received data frames:

writing the received data frame in the buffer area of index k, and incrementing modulo $N_T$ the index k by one;

a phase of writing the groups of blocks in the external memory comprising:

setting indices l, m and n to zero, so long as there are still blocks to be extracted in the buffer area of index l:

extracting a block from the buffer area of index l, adding the extracted block to the group of interleaved blocks to be formed, if the group of blocks comprises $N_T/2$ blocks, writing the group of blocks in a sequential area of the external memory, incrementing modulo $(N_T/2-1)$ the index m by one, and assigning to the index l the value $(n \times N_T/2+m)$, when all of the blocks of the frame stored in the buffer area of index l have been extracted:

incrementing modulo 2 the index n by one, and assigning to the index l the value $(n \times N_T/2)$.

17. A method of deinterleaving data blocks by a deinterleaving device configured for deinterleaving data blocks for an optical communications system handling communications between a satellite and an earth station, said deinterleaving device configured to receive as input sets of L interleaved data blocks, and to provide as output data frames including ordered data blocks, said deinterleaving device comprising a control module, an external memory to store the ordered data blocks, and a cache memory comprising a plurality of buffer areas each having a size at least equal to the size of one of the sets of the L interleaved blocks, said deinterleaving method comprising:

writing in an available one of the buffer areas each of the sets of the L interleaved blocks successively received, forming groups of the ordered data blocks from different ones of the interleaved data blocks belonging to different ones of the sets of the interleaved data blocks stored in different ones of the buffer areas, writing each of the groups of the ordered data blocks in a sequential area of the external memory, wherein each of the buffer areas is available if and only if the buffer area does not contain any of the interleaved data blocks that has not yet been used to form one of the groups of the ordered data blocks to be written in the external memory.

* * * * *